United States Patent [19]

Walther et al.

[11] Patent Number: 5,175,056
[45] Date of Patent: Dec. 29, 1992

[54] GALVANICALLY COMPATIBLE CONDUCTIVE FILLER

[75] Inventors: James F. Walther, Mountain Lakes; Robert J. Teichmann, Towaco; Andrew M. Wasowicz, West Patterson, all of N.J.

[73] Assignee: Potters Industries, Inc., Parsippany, N.J.

[21] Appl. No.: 535,365

[22] Filed: Jun. 8, 1990

[51] Int. Cl.$^5$ .............................................. B32B 15/02
[52] U.S. Cl. .................................... 428/403; 252/512; 252/513; 252/516; 252/520; 252/521; 420/903; 428/404; 428/469; 428/472; 428/699; 428/702
[58] Field of Search ............... 428/402, 403, 404, 469, 428/472, 328, 331, 699, 702; 252/512, 513, 516, 520, 521; 420/441, 451, 528, 537, 543, 544, 552, 557, 903

[56] References Cited

U.S. PATENT DOCUMENTS

| | | | |
|---|---|---|---|
| 2,299,813 | 10/1942 | Franks | 285/139 |
| 2,477,267 | 7/1949 | Robinson | 174/35 |
| 2,771,380 | 11/1956 | Coleman et al. | 117/227 |
| 3,140,342 | 7/1964 | Ehrreich et al. | 174/35 |
| 3,202,488 | 8/1965 | Ehrreich et al. | 29/192 |
| 3,562,124 | 2/1971 | Leon et al. | 204/128 |
| 3,583,930 | 6/1971 | Ehrreich et al. | 252/514 |
| 3,609,104 | 9/1971 | Ehrreich et al. | 252/511 |
| 3,687,742 | 8/1972 | Keith et al. | 117/230 |
| 3,837,894 | 9/1974 | Tucker, Jr. | 428/432 |

(List continued on next page.)

OTHER PUBLICATIONS

*Conductive Elastomer Gasket Design,* EMI Shielding Engineering Handbook, Chomerics, Inc., Woburn, MA, 25:25-26 (1985).

CRC Handbook of Chemistry And Physics, 56th Edition (Weast, Ed.), D51-D58 (1975-1976).

T. Yokoyama, *Mechanofusion Treatment With Angmill And Its Potential In Industrial Application,* Product Literature from the Micromeritics Laboratory of Hosokawa Micron International, Inc., Summit, New Jersey.

M. Alons, *Mechanism Of The Combined Coating-Mechanofusion Processing Of Powders,* Powder Technology, 59:45-52 (1989).

T. Yokoyama et al., *The Angmill Mechanofusion System And Its Applications,* KONA, No. 5, 59-68 (1987).

(List continued on next page.)

*Primary Examiner*—Paul J. Thibodeau
*Assistant Examiner*—Hoa T. Le
*Attorney, Agent, or Firm*—Curtis, Morris & Safford

[57] ABSTRACT

Composite particles designed as a filler for gaskets, caulking compounds and plastics in general. The unique properties are obtained by using a soft metal core galvanically similar to the metal the sealant will be in contact with. The oxide surface of the core metal is typically breached by a multitude of small hard semiconductive or conductive particles, thus making low particle-to-particle contact resistance through the body.

18 Claims, 8 Drawing Sheets

U.S. PATENT DOCUMENTS

| | | | |
|---|---|---|---|
| 3,882,507 | 5/1975 | Trimble et al. | |
| 3,892,600 | 7/1975 | Smeggil et al. | |
| 4,092,459 | 5/1978 | Deffeyes et al. | 428/403 |
| 4,119,763 | 10/1978 | Blair | 428/563 |
| 4,137,361 | 1/1979 | Deffeyes et al. | 428/328 |
| 4,218,507 | 8/1980 | Deffeyes et al. | 428/328 |
| 4,400,432 | 8/1983 | Buxbaum et al. | |
| 4,434,541 | 3/1984 | Powers, Jr. | 29/526 R |
| 4,507,359 | 3/1985 | Powers, Jr. | 428/328 |
| 4,678,716 | 7/1987 | Tzeng | 428/551 |
| 4,711,814 | 12/1987 | Teichmann | 428/403 |
| 4,725,508 | 2/1988 | Rangaswamy et al. | |
| 4,769,280 | 9/1988 | Powers, Jr. | 428/328 |
| 4,882,224 | 11/1989 | Moro et al. | |
| 5,021,368 | 6/1991 | Hoffman et al. | 501/92 |
| 5,026,605 | 6/1991 | Kitamura et al. | |
| 5,034,157 | 7/1991 | Merrell et al. | 252/512 |

OTHER PUBLICATIONS

*A New Method Of Agglomerating Heterogenous Powders*, Particle Fabrication, Product Literature of Bepex Corporation, Minneapolis, Minnesota.

*An Introduction To Powder Modification Technology*, Powder And Bulk Engineering, 50–54 (Feb., 1990).

J. S. Benjamin, *Mechanical Alloying*, Scientific American, 234:40–48 (1976).

B. Fultz et al., *Mechanical Alloying of Fe and V Powders: Intermixing And Amorphous Phase Formation*, J. Mater. Res., 4(6):1450–1455 (1989).

Bepex Corp. "*Process Equipment for Powder Surface Modification*" Sales Brochure.

El-Amin, "EMI Shielding-Part III: Conductive Additives" *Plastic Technology; Aug. 1981*.

MIKROPUL "Mechano Fusion System".

Military Specification-Shielding Gasket, Electronic, Elastomer, EMI/RFI, General Specification MIL-G-83528 (Apr. 1, 1988).

*Standard Method Of Salt Spray* (Fog) *Testing*, ASTM Designation:B117-85.

Product Bulletin for Information Circular No. 194 entitled *Mechano Fusion* ®, MikroPul, Hosakawa Micron International Inc., Summit, New Jersey.

Product Circular entitled *Mechano Fusion System*, MikroPul, Hosakawa Micron International Inc., Summit, New Jersey.

Bulletin P.1, *Process Equipment for Powder Surface Modification*, Bepex Corp., Rolling Meadows, Illinois.

E. J. Carlson, *Less Corrosive EMI Shielding Materials for Arrow Space Applications*, ITEM, 20–34 (1990).

D. M. Bigg et al., *Molded Composites As EMI Shields*, Industrial Research/Development, 103–105 (Jul. 1979).

H. L. El-Amin, *EMI Shielding-Part II Conductive Additives*, Plastics Technology, 67–72 (Aug., 1981).

GALVANICALLY COMPATIBLE CONDUCTIVE FILLER

FIELD OF THE INVENTION

The present invention relates to galvanically compatible conductive filler. The invention also relates and to new materials, e.g., gaskets, caulking compounds, adhesives, coatings, etc., which incorporate galvanically compatible conductive filler and which are useful for electromagnetic interference (EMI) shielding or for electrostatic dissipation.

Several publications, the disclosures of which are incorporated by reference, are cited to describe more fully the state of the art to which this invention pertains. The publications are identified in the following text by use of Arabic numerals in parentheses. Full citations for these references, to which the textual identifications are keyed, are found immediately preceding the claims.

BACKGROUND OF THE INVENTION

Conductive materials which are, to some degree, plastic would be useful in various technological applications.

For example, the level of electromagnetic radiation in the environment is relatively high, due to the increased utilization of electronic equipment. Sensitive electronic devices need protection from this radiation.

Protection can be provided by metallic shields. However, the substantial weight of solid metal shields, as well as the relatively high costs of such shields, makes their use impractical. Moreover, housings for electronic components are often constructed in two or more parts to allow for ready access to the electronic components. Metallic shields are ineffective for sealing gaps between the parts of such housings, and therefore are not suited for protecting the components within from adverse atmospheric conditions. Accordingly, it is desirable to provide an electromagnetic interference (EMI) shield which is sufficiently plastic to act as a sealant, to protect housed electronic components from the elements as well as to protect the components from EMI.

The basic requisite for an EMI shielding material is that it conduct electricity. Electrical conductivity can be imparted to plastics via incorporation of conductive fillers into the plastic matrix. Typical conductive fillers contain silver, nickel or copper. However, the housings for electronic components are typically made of aluminum. Because silver, nickel and copper are more noble than aluminum, these metals will set up a galvanic cell in contact with aluminum in the presence of moisture. In other words, there is an electrochemical potential difference between aluminum and the conductive fillers. This results in accelerated corrosion of the aluminum housing, which is referred to as galvanic corrosion (1).

Another application is use of suitably conductive, plastic material for electrostatic dissipation. Such a plastic material can be deposited on, for instance, a metal surface so that, when a person carrying a static charge touches the coated surface, the charge is bled off by the conductive material, rather than discharged in a spark. Of course, the plasticity of the material is useful in conforming it to the surface's configuration, etc. It will be appreciated that the same galvanic corrosion difficulties as discussed above are attendant to use of electrostatic dissipation materials.

To avoid galvanic corrosion, it is desirable to use for the conductive filler the same metal as that of which the housing is composed. Thus, in the case of an aluminum housing, it would be desirable to use aluminum powder as a filler for the sealant. However, the use of aluminum powder is disadvantageous in that the oxide film on the aluminum particles prevents the passage of electricity due to the high resistivity of the oxide.

OBJECTS OF THE INVENTION

It is therefore an object of the present invention to provide an electrically conductive composite material which is galvanically compatible with a given metal.

It is another object of the present invention to provide a material suitable for electrostatic shielding or electrostatic applications, which incorporates an electrically conductive composite material as filler.

It is another object of the present invention to provide an electromagnetic interference shielding material which incorporates a plurality of electrically conductive composite particles which are galvanically compatible with a metal constituting the housing for electronic components.

It is a further object of the present invention to provide an electromagnetic interference shielding material which is simultaneously capable of protecting electrical components contained within a housing from adverse atmospheric conditions and to reduce substantially galvanic corrosion.

It is yet another object of the present invention to provide methods for making and using the aforementioned materials, including providing electromagnetic shielding between two surfaces.

Various other objects, advantages and features of the invention will become readily apparent from the ensuing description of the invention.

SUMMARY OF THE INVENTION

In one aspect, the invention is a composite particle comprising in combination an electrically conductive core material, having a surface oxide layer, and an electrically conductive refractory material, the core material and the refractory material being conductively fused. The term "conductively fused" as used herein refers to a condition in which the refractory material is integral with the core material and/or with the surface oxide layer, such that the refractory material is in contact with or sufficiently proximate the core material that electrons can pass back and forth between the two. The state of being conductively fused includes embodiments in which the refractory material is separated from the core material by some amount of surface oxide layer, as long as the interposed oxide does not prevent substantial passage of electrons.

In a second aspect, the invention is a composite particle comprising in combination an electrically conductive core material having a surface oxide layer and an electrically conductive refractory material, the particle being configured such that the refractory material provides a conductive path through the oxide layer to the core material.

In another aspect, the invention is an electromagnetic energy shielding material comprising in combination a binder matrix and a plurality of composite particles dispersed throughout the matrix, each of the particles comprising in combination an electrically conductive core material having a surface oxide layer and an electrically conductive refractory material, the core material and the refractory material being conductively fused.

Yet another aspect of the invention is directed to a method of providing electromagnetic shielding which comprises locating an electromagnetic shielding material adjacent to said surface, said material comprising in combination a binder matrix and a plurality of composite particles dispersed throughout the matrix, the particles comprising in combination an electrically conductive core material having a surface oxide layer and an electrically conductive refractory material, the core material and the refractory material being conductively fused.

Still another aspect of the invention is directed to a method for preparing a composite particle, which comprises contacting an electrically conductive core material in particulate form, said core material particles having a surface oxide layer, with an electrically conductive refractory material in particulate form under conditions such that the core material and the refractory material are conductively fused.

In another aspect, the invention is directed to a method for preparing an electromagnetic energy shielding material which comprises admixing a binder matrix with a plurality of composite particles so as to disperse the particles throughout the matrix, each of the particles comprising in combination an electrically conductive core material having a surface oxide layer and an electrically conductive refractory material, the core material and the refractory material being conductively fused.

Various other objects, advantages and features of the invention will become readily apparent from the ensuing description of the invention, when read with reference to the accompanying figures wherein:

DESCRIPTION OF CERTAIN PREFERRED EMBODIMENTS OF THE INVENTION

Figure 1:
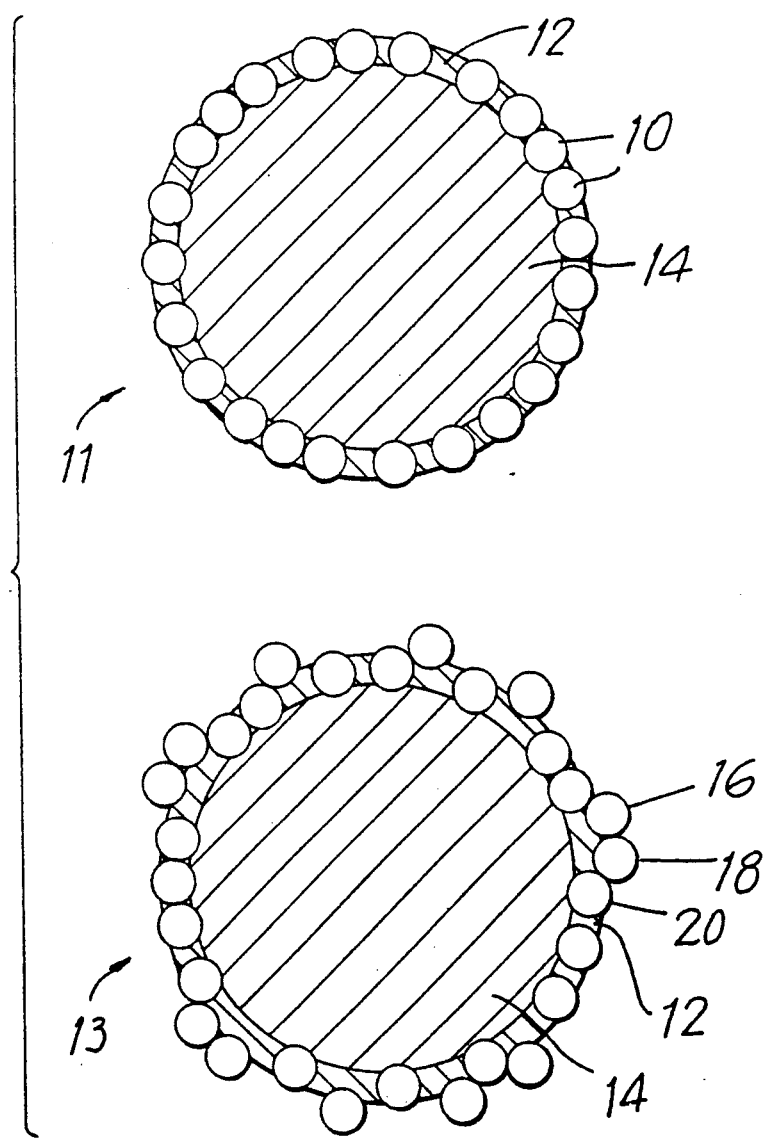
FIG. 1 is a schematic representation of certain embodiments of the composite particles according to the invention.

The term "particle" as used herein refers to a small quantity of matter which can be spherical or irregular in shape. Advantageously, particles in accordance with the invention are irregular in shape.

The term "electrically conductive" as used herein refers to a material which obeys Ohm's law and therefore is capable of conducting electricity. An electrically conductive core material in accordance with the invention advantageously has a resistivity of less than about $15 \times 10^{-6}$ ohm-cm at 0° C., more advantageously below about $10 \times 10^{-6}$ ohm-cm. The core material can be any material which is capable of conducting electricity. Advantageously, the core material can be a conductive metal or metal alloy, especially one which is more anodic than the metal of the substrate (e.g., the metal of the housing) to be protected. The core material can be selected from various suitable metals, the specific choice in each case depending upon the metal of the substrate to be protected. Advantageously, the metal can be aluminum, tin, zinc, nickel or magnesium. Other metals can be used, as well as metal alloys, so long as these metals or metal alloys are electrically conductive. Optimum galvanic compatibility can be achieved by using for the core material the same metal as that of the substrate to be protected.

The core material has a surface oxide layer. The aforementioned metals and alloys typically form oxides when in contact with ambient atmosphere, and thus naturally carry an oxide coating. For example, in the case where the core material is aluminum, the oxide layer is $Al_2O_3$.

The term "refractory material" as used herein refers to a chemical compound which is capable of conducting electricity and which is slow to melt and which resists the action of heat. Refractory materials in accordance with the invention can typically be selected from a variety of refractory materials well known in the art (2). The refractory material in accordance with the invention can be a single refractory material or a combination of two or more refractory materials. In certain advantageous embodiments, the refractory material has a hardness which is greater than the hardness of the core material. In certain other preferred embodiments such as where the oxide layer of the core material is particularly thick, the refractory material can be harder than the oxide layer. Typically, the hardness of the core material is on the order of about 1 to 6 Mohs and the hardness of the refractory material is on the order of about 3 to 10 Mohs. Advantageously, the refractory material has a resistivity less than 1 ohm-cm. Preferred refractory materials include WC, NbB, $NbB_2$, TiN, $VSi_2$, MoB, $TiB_2$, $ZrB_2$, $B_4C$, ZrN, $CoSi_2$ and $MoSi_2$.

In certain advantageous embodiments, the core material and the refractory material are conductively fused by configuring the particle such that the refractory material provides a conductive path through the oxide layer of the core material to the core material itself. Typically, the refractory material breaches the oxide layer so as to make contact with the core material and extend outwardly from the oxide layer. Thus, an electrical current can be conducted through the oxide layer to the core material via the refractory material.

In the composite particles according to the invention, the core material is present in an amount of about 10 to 99.5 weight percent, preferably about 30 to 95 weight percent, more preferably about 60 to 90 weight percent, and the refractory material is present in an amount of about 90 to 0.5 weight percent, preferably about 70 to 5 weight percent, more preferably about 40 to 10 weight percent. Generally, the particles of the refractory material are of size ranging from about twice the thickness of the oxide layer of the core particle to about one tenth the size of the core particle. Advantageously, the core has a particle size of about 0.5 to 200 microns in average dimension, preferably about 10 to 90 microns, more preferably about 20 to 45 microns, the oxide layer has an average thickness of about 2 to 10,000 angstroms, preferably about 3 to 500 angstroms, more preferably about 5 to 100 angstroms and still more preferably about 5 to 15 angstroms, and the refractory material has a particle size of about 0.005 to 20 microns in average dimension, preferably about 0.05 to 5 microns, more preferably about 0.1 to 1 micron. Preferred composite particles include the following (the refractory material is listed first with the core material following the slash): WC/Al; TiN/Al; VSi$_2$/Al; NbB/Al; WC/Sn; and NbB/Sn.

FIG. 1 shows two embodiments, 11 and 13, of the composite particles according to the invention. In composite particle 11, the refractory material particles 10 extend outwardly from oxide layer 12, and also breach it to make contact with core material 14. Thus, in another embodiment of the invention, a composite particle comprises in combination an electrically conductive core material, having a surface oxide layer, and an electrically conductive refractory material wherein the refractory material comprises a plurality of particles, each of which particles breaches the oxide layer so as to make contact with the core material and extends outwardly or protrudes from the oxide layer. Compare composite particle 13, in which refractory material particles 16 and 18 extend from and breach oxide layer 12 of core material 14 but do not make direct contact with core material 14 as do refractory material particles 10 in composite particle 11. Rather, refractory material particles 16 and 18 make indirect contact with core material 14 through contact with refractory material particle 20 which makes direct contact with core material 14.

The method of making the composite particles preferably comprises the step of contacting the various materials as aforesaid so that the particle is configured such that the refractory material provides a conductive path to the core material through the oxide layer. Typically, the oxide layer is breached by the refractory material. Advantageously, the refractory material is embedded in the electrically conductive core material.

The composite particles according to the invention can be prepared by mechanofusion, hybridization and/or mechanical alloying. The term "mechanofusion" as used herein refers to a process whereby materials with new properties are created by imparting extreme forms of mechanical energy to two or more kinds of materials under a controlled condition, thereby causing a mechanochemical reaction on the surfaces of such materials being processed. The mechanofusion process is well known in the art (3,4,5). The term "hybridization" as used herein, refers to a method of modifying particle structure and surfaces by embedding or dry filming a fine particle onto the surface of a core particle. The hybridization process is also well known in the art (6,7). Like mechanofusion and hybridization, mechanical alloying, especially ball milling, is well known in the art (8,9). Accordingly, the composite particles of the present invention can be readily made by those skilled in the art.

As noted above, the invention also resides in, respectively, an electromagnetic energy shielding material and an electrostatic dissipation material. Each comprises in combination a binder matrix and a plurality of composite particles, as described herein, dispersed throughout the matrix. The material can take the form of a gasket, caulk, adhesive, coating, etc.

Figure 2:
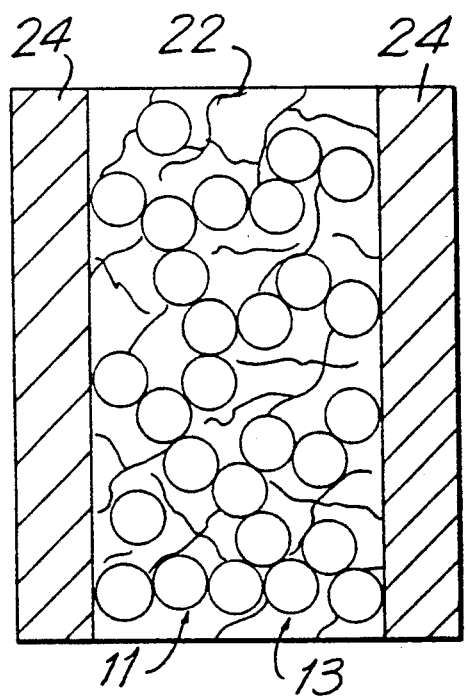
FIG. 2 is a schematic representation of a gasket material according to the invention.

FIG. 2 is a schematic representation of a gasket material 22 sandwiched between metal plates 24. Gasket material 22, an electromagnetic shielding material, is filled with a plurality of composite particles 11 and 13, as previously described in FIG. 1 and depicted herein as circles for the sake of simplicity. Conductive particles 11 and 13 are networked in such a way as to provide a conductive pathway for electrical current. Alternatively, another embodiment would be an electromagnetic shielding or electrostatic dissipation coating, shown at 22, on right-hand plate 24 which is a surface of, for example, an equipment housing (the left-hand plate is disregarded in this case).

In another aspect, the invention is an electromagnetic energy shielding material or electrostatic dissipation material comprising in combination a binder matrix and a plurality of composite particles dispersed throughout the matrix, the particles comprising in combination an electrically conductive core material, having a surface oxide layer, and an electrically conductive refractory material, each particle being configured such that the refractory material breaches the oxide layer so as to make contact with the core material and extend outwardly from the oxide layer.

In yet another embodiment, the invention is a corrosion protection material. In this application the composite particles described hereinabove are incorporated in a suitable binder matrix. The resulting composition is applied to a metal surface and serves to protect the metal surface from corrosion. The composition (a gasket, caulk, coating or adhesive) would serve as a sacrificial anode for the metal surface. The composition, e.g., a gasket, is deteriorated to a certain extent at which point it can be replaced with a new gasket and the protection can be continued. This material functions not only as an EMI shield and an environmental shield but also as a sacrificial anode. Thus, this material would protect the contacted base metal surface from further corrosion.

Various binder materials, both organic and inorganic, can be used, the choice of a particular binder being dependent upon the characteristics which are desired for the shielding, dissipation or corrosion protection material in each particular case. For example, the binder can include various synthetic resins, such as epoxies, chlorinated rubber, polystyrene, polyvinyl butyryl resins, polyvinyl acetate resins, silicones, and the like. Inorganic binders can also be used, including binders obtained from silicates, such as alkali metal silicates and sodium silicates, phosphates, hydrolyzed ethyl silicates, butyl-titanates, etc. The use of these and other similar binding materials will be apparent to those skilled in the art so that the particular binder suitable in each case can be selected for use in the shielding, dissipation or corrosion protection material according to the invention. Advantageously, the binder is present in the shielding material in an amount of about 20 to 80% by weight, the balance being the composite particles described above. Depending upon the particular binder used, the shielding material can also contain suitable solvents, curing agents, catalysts, plasticizers and the like, all known in the art. The specific amounts of these components, as well as the types used, will depend in each case upon the particular binder as well as the characteristics desired for the particular shielding, dissipation or corrosion protection material and its use.

The shielding, dissipation or corrosion protection material can be applied to the metal substrate to be protected using any suitable technique, for example, spraying, brushing, immersion, flowing, etc. When the material is used as a gasket or caulk, the material is typically interfaced between the two surfaces to be sealed. The materials of the present invention can be formulated by admixing the binder and composite particle components, in the proportions as have been set forth hereinabove, using any suitable mixing techniques.

The type and extent of drying or curing will vary in each case, depending on the specific nature of the binder used. For example, in some cases, heating can be utilized to effect drying or cure of the coating while in other cases, simple air drying or curing will be sufficient. The thus-formed shielding or dissipation materials are found to provide excellent corrosion protection for the metal substrates to which they are applied as well as excellent EMI shielding or electrostatic dissipation.

The invention will be more fully described and understood with reference to the following examples which are given by way of illustration.

Figure 3:
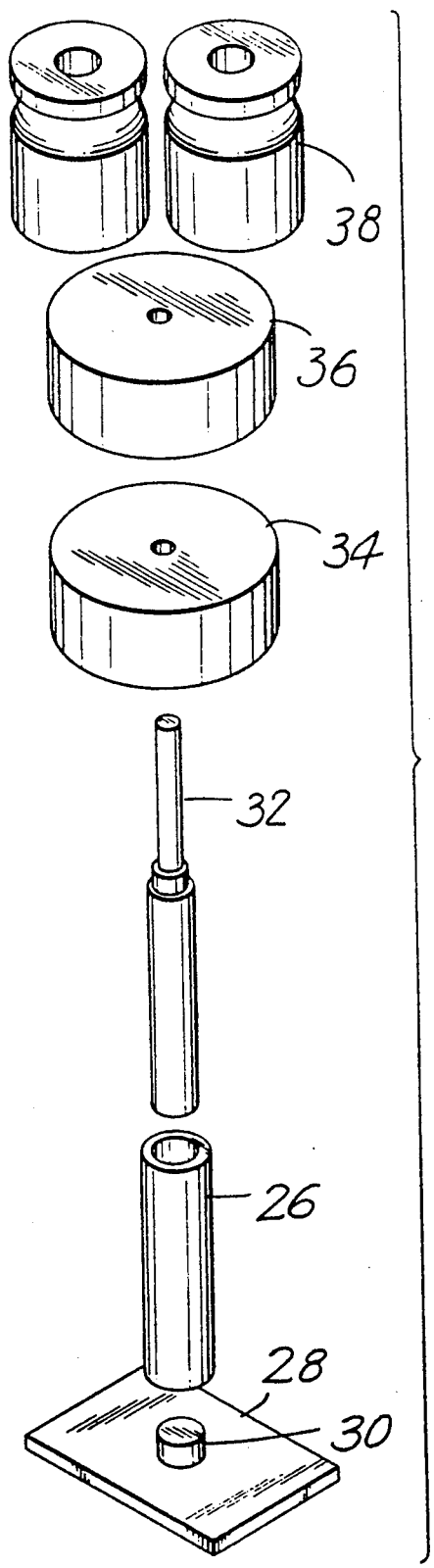
FIG. 3 depicts a device for measuring the powder resistivity of the composite particles according to the invention.

In the following examples, the volume resistivity for the composite particles according to the invention was measured and calculated in accordance with the following description and FIG. 3. Referring to FIG. 3, a precision glass tube 26 (bore tolerance ±½ thousandth of an inch, ¼" I.D.×¾" O.D.×3" L, 0.25" wall thickness) is placed on a copper plate 28 (¼"×2"×3") having a nipple 30. One of the open ends of the glass tube 26 insertingly receives nipple 30. The powder sample to be measured is split with a one-to-one splitter on a piece of clean paper until a sample of approximately 5 grams is obtained. A 5 gram sample is then accurately weighed and placed into the glass tube using a small funnel. The copper plate with attached glass tube is then placed on a Syntrol Electric Vibrator Model FC-TO. A copper rod 32 (¼" D ×5¼" L) is placed on the sample by inserting the copper rod into the glass tube 26. A one kilogram weight 34 is then placed on the copper rod, the range of the electric vibrator is set at 4.5 and the vibrator is then turned on for 60 seconds. The vibrator is then turned off and the height (cm) of the sample between the faces of the copper plate and the copper rod is measured with a ruler. Two clip-type probes (positive) are then attached to the top of the copper rod and two clip-type probes (negative) are attached to the contact on the copper plate. A resistance reading is then taken using a Hewlett Packard Milliohmmeter Model 4328A. A second one kilogram weight 36 is then placed on top of the first one kilogram weight 34, the total weight is recorded as two kilograms and a second resistance reading is recorded. Two 1 lb. weights 38 are then placed on top of the two 1 kilogram weights, the total weight is recorded as 2.907 kilograms and a third resistance measurement is recorded. The height of the sample is again measured with a ruler as above.

The volume resistivity (P, ohms-cm) and the average volume resistivity are calculated as follows:

1. Calculate volume resistivity (ohms-cm) of the sample with the formula $$P = \frac{R \frac{d^2}{4} pi}{L}$$

where:
P=resistivity (ohms-cm)
R=resistance (ohms)
d=inside diameter of glass tube (cm)
L=sample height (cm).

2. Average (mean) of the sample can be calculated as $$\bar{x} = \frac{\text{sum of } X}{N}$$

where:
$\bar{x}$=average (mean) of sample
x=sample value
N=number of tests.

EXAMPLE 1

The following is an example of the preparation of composite particles according to the invention via mechanofusion. Thirteen samples (1A–1C, 2A–2D, 3A, 3B, 4A–4C and 5) were prepared using mechanofusion. Table 1 summarizes the processing parameters for each of the thirteen samples.

In the preparation of sample 3A, which is representative, aluminum spheres, 180 g, 75 microns, and titanium nitride, 50 g, 1–5 microns, were charged into the mixing chamber of a Hosakowa AM-15F mechanofusion machine equipped with a glovebox. The mixing chamber was sealed by installing the cover and bolting firmly. The glove box was secured over the chamber and argon gas was then purged into the chamber until the percentage of oxygen dropped to about 0.7%. Rotation of the mixing chamber was then initiated to a speed of about 500 RPM for two minutes. The speed was then increased to 900 RPM for three minutes and further increased to 1200 RPM for 35 minutes. At the end of the 35 minute period, the temperature increased to 159° C. Rotation was then stopped and the material was allowed to cool in the chamber under an argon atmosphere. When the material cooled to 75° C., it was removed from the chamber and allowed to cool to room temperature in air.

Figure 4:
FIGS. 4, 6 and 7 show scanning electron micrographs (SEM) of composite particles according to the invention.
Figure 5:
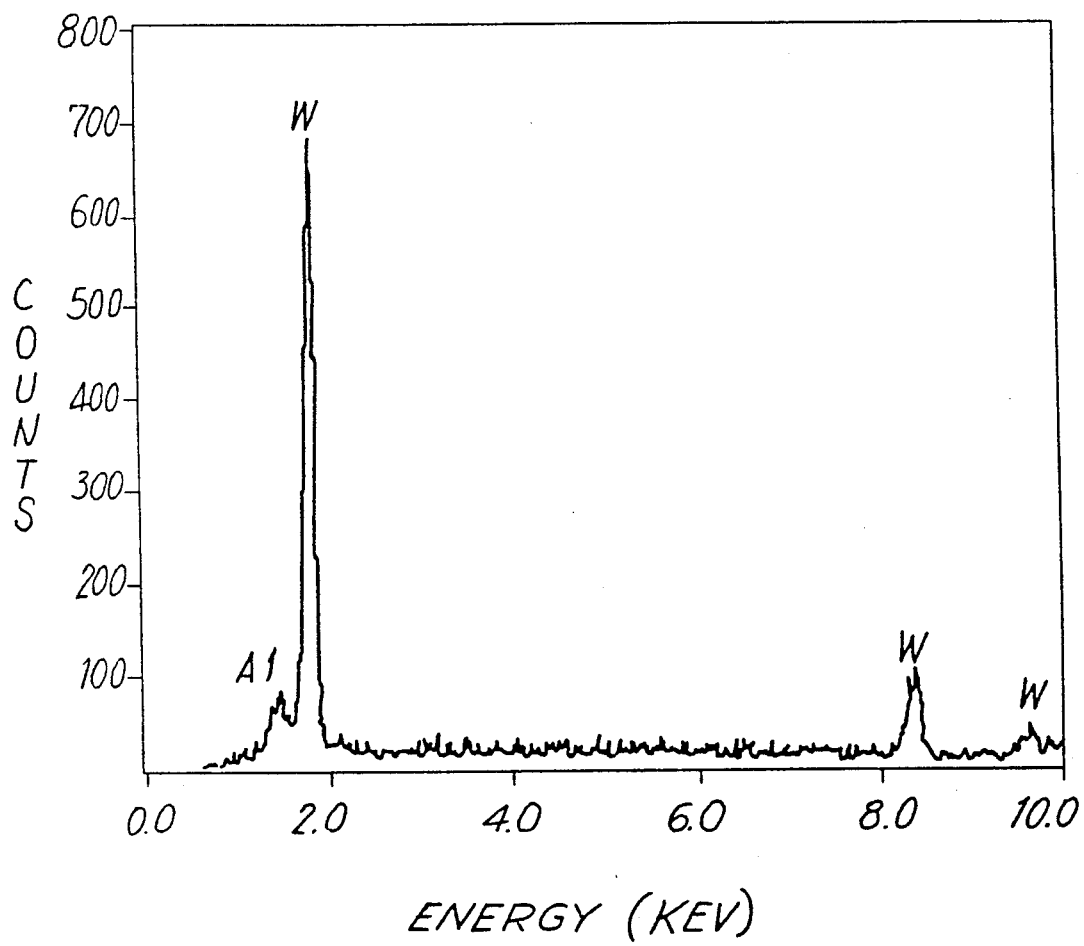
FIGS. 5 and 8 are X-ray energy dispersive spectra of composite particles according to the invention.

A scanning electron micrograph (SEM) of a single TiN/Al composite particle from the sample 2D is shown in FIG. 4 for purposes of illustration. In FIG. 4, the irregularly shaped, light banded areas correspond to the refractory material particles embedded in the core material and extending outwardly from the oxide layer. FIG. 5 is an X-ray dispersive spectrum of a powder of WC/Al particles prepared by the mechanofusion process described hereinabove. Resistivity measurements were taken for nine of the thirteen samples and are summarized in Table 2.

TABLE 1

| | | Mechanofusion Process Parameters | | | | | |
|---|---|---|---|---|---|---|---|
| SAMPLE NO. | CORE MATERIAL | REFRACTORY MATERIAL | TIME (min.) | TEMP. (°C.) | RPM | POWER (KW) | O₂ % |
| 1A | Al (180 g) | WC (60 g) | 0:00 | 27.8 | 500 | 0.22 | 0.6 |
| | | | 2:00 | 27.8 | 900 | 0.42 | 0.5 |
| | | | 5:00 | 48.8 | 1200 | 0.7 | 0.4 |
| | | | 7:46 | 75.8 | 1200 | 0.62 | 0.4 |
| | | | 14:47 | 104.5 | 1200 | 0.62 | 0.2 |
| | | | 24:00 | 128.0 | 1200 | 0.6 | 0.1 |
| | | | 5:00 | 129.7 | 1200 | 0.6 | 0.1 |

TABLE 1-continued

| | | Mechanofusion Process Parameters | | | | |
|---|---|---|---|---|---|---|
| SAMPLE NO. | CORE MATERIAL | REFRACTORY MATERIAL | TIME (min.) | TEMP. (°C.) | RPM | POWER (KW) | O$_2$ % |
| 1B | Al (180 g) | WC (60 g) | RESTART | 103.2 | 1200 | 0.6 | 0.5 |
| | | | 30:00 | 128.6 | 1200 | 0.58 | 0.4 |
| | | | 35:00 | 136.5 | 1200 | 0.58 | 0.4 |
| 1C | Al (180 g) | WC (60 g) | RESTART | 106.2 | 1200 | 0.58 | 0.4 |
| | | | 43:43 | 132.2 | 1200 | 0.58 | 0.7 |
| 2A | Al (150 g) | WC (100 g) | 2:00 | 44.6 | 900 | 0.4 | 0.3 |
| | | | 5:00 | 65.6 | 1200 | 0.62 | 0.1 |
| | | | 13:30 | 130.9 | 1200 | 0.62 | 0.1 |
| | | | 15:00 | 138.0 | 1200 | 0.62 | 0.1 |
| | | | 20:00 | 151.4 | 1200 | 0.62 | 0.0 |
| | | | 25:00 | 161.6 | 1200 | 0.62 | 0.1 |
| 2B | Al (150 g) | WC (100 g) | RESTART | 129.2 | 1200 | 0.58 | 1.7 |
| | | | 30:00 | 149.4 | 1200 | 0.58 | 0.9 |
| | | | 35:00 | 155.3 | 1200 | 0.58 | 0.7 |
| 2C | Al (150 g) | WC (100 g) | RESTART | 130.3 | 1200 | 0.42 | 0.6 |
| | | | 40:00 | 136.6 | 1200 | 0.42 | 0.3 |
| | | | 45:00 | 137.8 | 1200 | 0.42 | 0.2 |
| 2D | Al (150 g) | WC (100 g) | RESTART | 115.1 | 1600 | 0.48 | 0.4 |
| | | | 50:00 | 120.4 | 1600 | 0.48 | 0.3 |
| | | | 55:00 | 123.7 | 1600 | 0.48 | 0.2 |
| | | | 60:00 | 128.0 | 1600 | 0.48 | 0.2 |
| 3A | Al (180 g) | TiN (50 g) | 0:00 | 55.3 | 500 | 0.22 | 0.7 |
| | | | 2:00 | 56.6 | 900 | 0.4 | 0.4 |
| | | | 5:00 | 68.6 | 1200 | 0.58 | 0.4 |
| | | | 10:31 | 103.1 | 1200 | 0.58 | 0.4 |
| | | | 17:00 | 127.2 | 1200 | 0.60 | 0.3 |
| | | | 20:00 | 138.0 | 1200 | 0.60 | 0.2 |
| | | | 23:00 | 144.6 | 1200 | 0.60 | 0.2 |
| | | | 26:25 | 151.0 | 1200 | 0.60 | 0.2 |
| | | | 30:33 | 156.9 | 1200 | 0.58 | 0.2 |
| | | | 35:00 | 162.0 | 1200 | 0.58 | 0.1 |
| 3B | Al (180 g) | TiN (50 g) | RESTART | 134.3 | 1200 | 0.58 | 0.4 |
| | | | 40:00 | 151.3 | 1200 | 0.58 | 0.4 |
| | | | 43:30 | 156.5 | 1200 | 0.58 | 0.3 |
| | | | 45:00 | 158.7 | 1200 | 0.58 | 0.3 |
| 4A | Sn (180 g) | WC (50 g) | 0:00 | 23.8 | 500 | 0.22 | 0.6 |
| | | | 2:00 | 26.0 | 900 | 0.25 | 0.5 |
| | | | 5:00 | 27.9 | 1200 | 0.32 | 0.4 |
| | | | 10:00 | 32.8 | 1200 | 0.3 | 0.3 |
| | | | 15:00 | 35.4 | 1200 | 0.3 | 0.2 |
| | | | 25:00 | 37.1 | 1200 | 0.3 | 0.1 |
| 4B | Sn (180 g) | WC (50 g) | RESTART | 33.2 | 1200 | 0.3 | 0.7 |
| | | | 30:00 | 36.1 | 1200 | 0.3 | 0.3 |
| | | | 35:00 | 36.1 | 1200 | 0.28 | 0.1 |
| 4C | Sn (180 g) | WC (50 g) | RESTART | 33.8 | 1200 | 0.25 | 0.2 |
| | | | 40:00 | 33.3 | 1200 | 0.25 | 0.1 |
| | | | 45:00 | 32.0 | 1200 | 0.25 | 0.1 |
| 5 | Sn (75 wt. %) | WC (25 wt. %) | — | — | — | — | — |

TABLE 2

| | Powder Resistivity Measurements | | | | | |
|---|---|---|---|---|---|---|
| SAMPLE NO. | APPLIED WT. (g) | SAMPLE WT. (g) | HEIGHT (CM) | MEAS. R (Ω) | CALC.* P (Ω CM) | AVG (Ω CM) |
| 1A | 1 | 5 | 2.2 | 28.0 | 16.60 | 10.39 |
| | 3 | | 2.2 | 8.0 | 4.63 | |
| 1B | 1 | 5 | 2.2 | 24.0 | 13.85 | 9.01 |
| | 2 | | 2.2 | 7.2 | 4.10 | |
| 1C | 1 | 5 | 2.2 | 25.0 | 14.43 | 9.87 |
| | 2 | | 2.2 | 9.2 | 5.31 | |
| 2A | 1 | 5 | 1.9 | 1.10 | 0.74 | 0.56 |
| | 2 | | 1.9 | 0.58 | 0.39 | |
| 2B | 1 | 5 | 2.0 | 1.75 | 1.11 | 0.72 |
| | 2 | | 1.9 | 0.48 | 0.32 | |
| 2C | 1 | 5 | 1.8 | 1.15 | 0.81 | 0.58 |
| | 2 | | 1.8 | 0.49 | 0.35 | |
| 2D | 1 | 5 | 1.8 | 2.00 | 1.41 | 0.84 |
| | 2 | | 1.8 | 0.38 | 0.27 | |
| 3A | 1 | 5 | 2.5 | 4.3 | 2.18 | 1.74 |
| | 2 | | 2.4 | 2.45 | 1.30 | |
| 3B | 1 | 5 | 2.5 | 24.0 | 12.19 | 7.21 |
| | 2 | | 2.5 | 4.4 | 2.24 | |

*CALC. = $\dfrac{\text{READING} \times 1.27 \text{ cm}^2}{\text{HEIGHT (cm)}}$

EXAMPLE 2

The following is an example of the preparation of composite particles according to the invention via hybridization. The core materials used were aluminum and tin. The aluminum particles were somewhat spherical in shape with an average particle size of 60 microns and a specific gravity of 2.7. The tin particles had a variety of shapes ranging from spherical to cylindrical. The average particle size was between 200 and 325 mesh as raw feed. However, after the hybridization process, many tin particles were rounded into a more spherical shape. The refractory materials used were tungsten carbide and niobium boride. The niobium boride ranged in size from 1 to 5 microns and had a specific gravity of 7. The tungsten carbide particles were sub-micron with a specific gravity of 14. Four runs were conducted using a Bepex Model No. HYB-O Hybridizer and Model No. OMD-O O.M. Dizer. Tip speeds (12,000 RPM) and residence times (1 min.) were held to low values in order to minimize abrasion. The process particulars and parameters are summarized in Table 3.

Figure 6A:
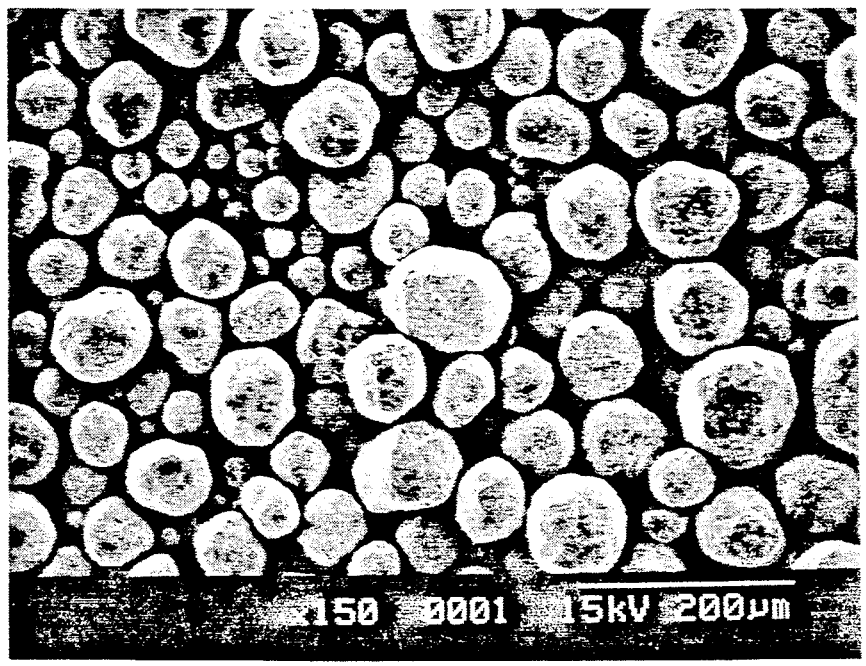
Figure 6B:
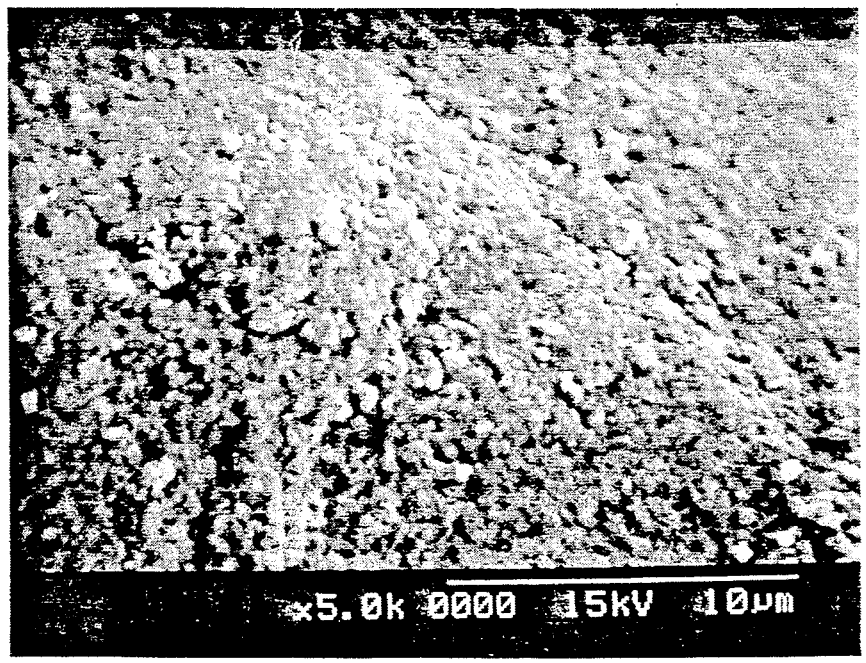

In Run 1, which is representative, aluminum spheres, 25.5 g, 60 microns, and tungsten carbide, 4.5 g, 0.5 microns, were charged into the mixing chamber of the Dizer. The Dizer mixer was started and operated at 1500 RPM for four minutes to mix the two raw materials. The mixture was then placed into the mixing chamber of the Hybridizer. The hybridizer was operated for one minute at 12,000 RPM. The material was then allowed to cool to room temperature in air. FIG. 6A is an SEM of a field of numerous WC/Al composite particles obtained from the hybridization process described hereinabove and FIG. 6B is a magnified SEM view of the surface of a single WC/Al composite. Referring to FIG. 6B the refractory material particles are finer in size and more tightly packed than the refractory material particles in FIG. 4. Resistivity measurements were taken on material obtained from each of the four runs and are summarized in Table 4.

TABLE 4

Powder Resistivity Measurements

| Sample* | RESISTIVITY (Ω cm) |
|---|---|
| WC,15%/Al,85% (Run 1) | 1.70 |
| WC,25%/Sn,75% (Run 2) | 0.01 |
| NbB,25%/Al,75% (Run 3) | 2.00 |
| NbB,25%/Sn,75% (Run 4) | 0.76 |

*Percents Given Are Weight Percent

EXAMPLE 3

Figure 7A:
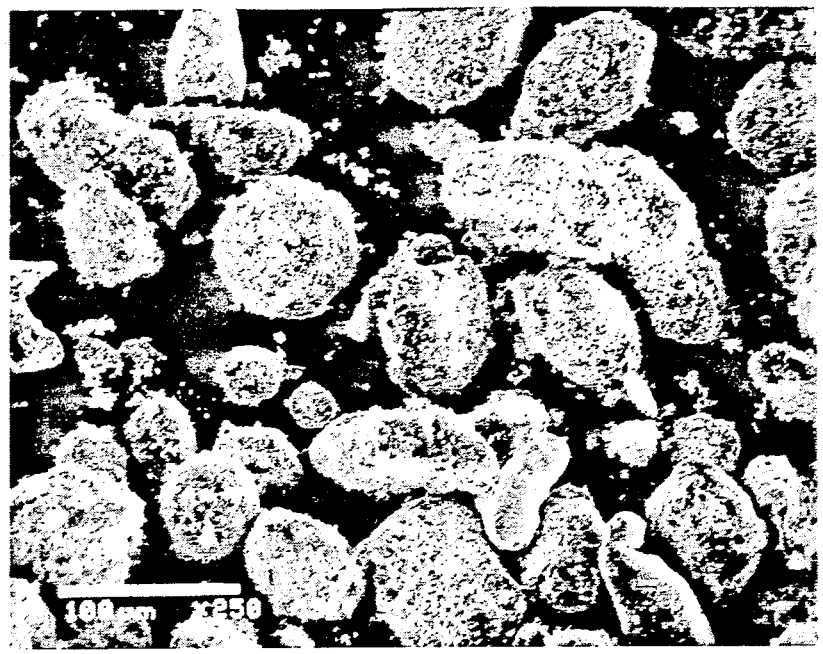
Figure 7B:
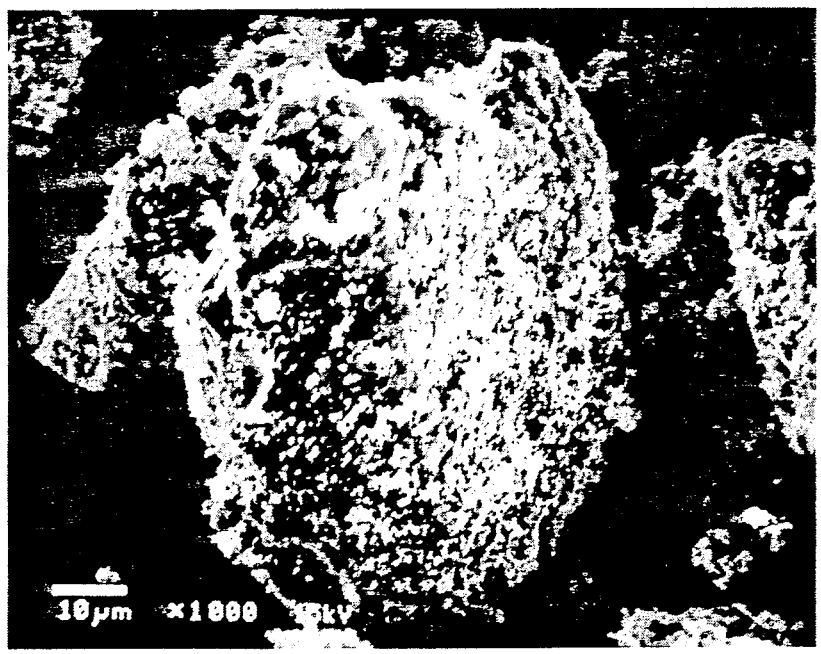
Figure 8:
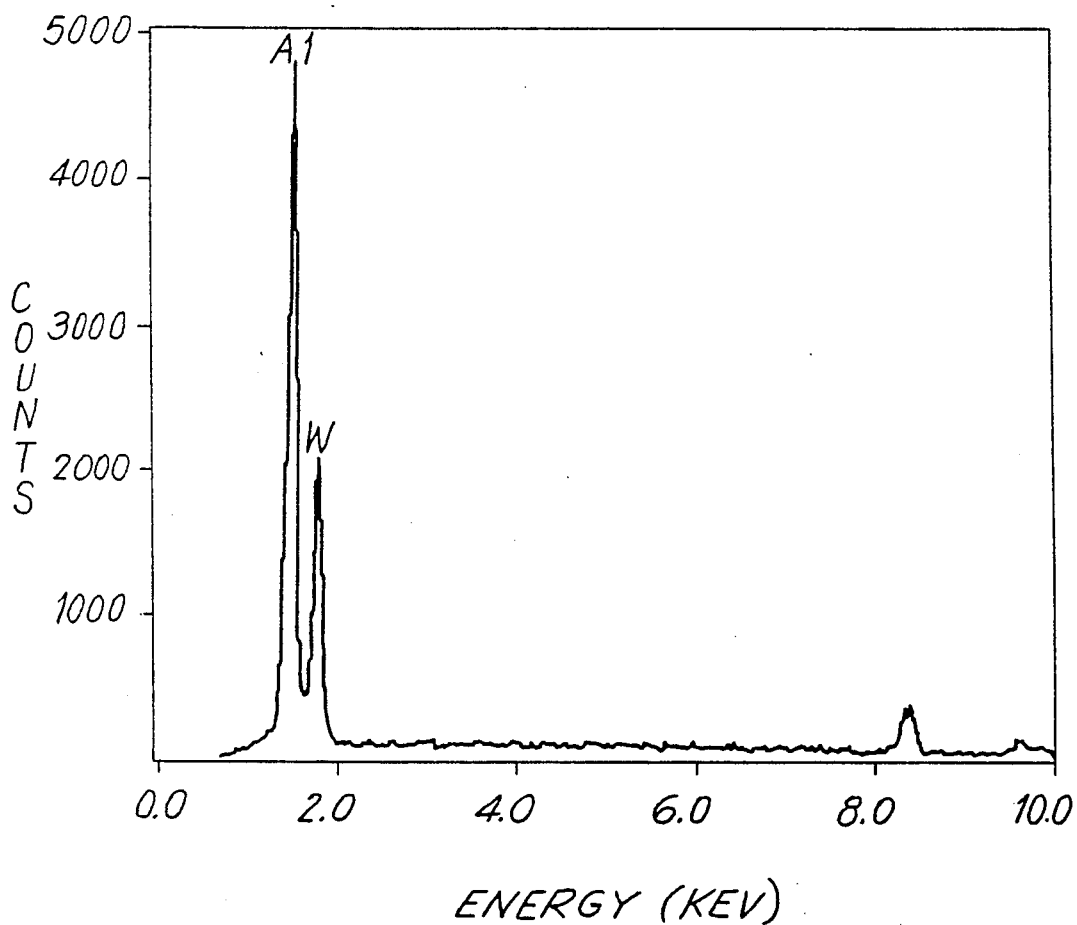

The following is an example of the preparation of composite particles according to the invention by ball milling. Aluminum spheres, in an amount of 75 g, size 75 microns, tungsten carbide particles, in an amount of 25 g, size 0.5 microns, and porcelain balls, in an amount of 500 g, size 0.5" in diameter, were charged into a ball mill jar. The ball mill jar was placed on a roller mill and the roller mill was activated so that the jar rotated at 75 RPM. After two hours, the jar was removed from the roller mill and the contents of the jar were poured over a 20 mesh screen. The product from the screen was collected in a pan. FIG. 7A is an SEM of a field of numerous WC/Al composite particles so prepared and FIG. 7B is a magnified SEM view of the surface of one such particle. FIG. 8 is an X-ray energy dispersive spectrum of the WC/Al particles so prepared. Referring to FIG. 7B, while the refractory material particles (light-shaded areas) are fine in size and tightly packed as compared to those of FIG. 4, the dark-shaded areas correspond to surface areas of the composite which are devoid of and/or have a low concentration of refractory material particles. This is reflected in the X-ray energy dispersive spectrum of FIG. 8. The Al peak is of much greater intensity relative to the W peak than the corresponding Al peak in the spectrum of FIG. 5, indicating that there are areas of the composite shown in FIG. 7B having a lesser degree of refractory particle embedding.

The resulting material had a powder resistivity of 5 ohm-cm. An additional run yielded a composite mate-

TABLE 3

Hybridization Process Parameters

| | RUN 1 | RUN 2 | RUN 3 | RUN 4 |
|---|---|---|---|---|
| CORE MATERIAL | Al | Sn | Al | Sn |
| PARTICLE SIZE ($d_{sq.}$ - μm) | 60 | 60 | 60 | 60 |
| DENSITY Sp. Gr. (g/cm$^3$) | 2.7 | 7.31 | 2.7 | 7.31 |
| MIXING RATIO (BY WEIGHT) | 85% (25.5 g) | 75% | 75% | 75% |
| REFRACTORY MATERIAL | WC | WC | NbB | NbB |
| PARTICLE SIZE ($d_{50}$ - μm) | 0.50 | 0.50 | 2 | 2 |
| DENSITY Sp. Gr. (g/cm$^3$) | 14 | 14 | 7 | 7 |
| MIXING RATIO (BY WEIGHT) | 15% (4.5 g) | 25% | 25% | 25% |
| O.M. DIZER | | | | |
| MODEL NO. | OMD-O | OMD-O | OMD-O | OMD-O |
| POWER LOAD (Amps) | 1.55 | 1.51 | 1.55 | 1.55 |
| RUN TIME (min.) | 4 | 4 | 4 | 4 |
| HYBRIDIZER | | | | |
| MODEL NO. | HYB-O | HYB-O | HYB-O | HYB-O |
| ROTOR SPEED (RPM) | 12,000 | 12,000 | 12,000 | 12,000 |
| RUN TIME (min.) | 1 | 2 | 2 | 2 |
| FEED INITIAL CHARGE (g/batch) | 30 | 30 | 30 | 30 |
| POWER LOAD (Amps) | 4.2 (0 min) 4.2 (1 min) | 4.5 (0 min) 4.5 (1 min) 4.4 (2 min) | 4.3 (0 min) 4.2 (1 min) 4.2 (2 min) | 4.25 (0 min) 4.4 (1 min) 4.4 (2 min) |
| INNER TEMPERATURE (°C.) | 29 (0 min) 45 (1 min) | 29 (0 min) 56 (1 min) 64 (2 min) | 30 (0 min) 52 (1 min) 59 (2 min) | 34 (0 min) 56 (1 min) 67 (2 min) | rial with a powder resistivity of 1.8 ohm-cm. For comparison, the same proportions of tungsten carbide and aluminum powders were physically mixed and the resistivity of the resulting mixture was $4 \times 10^7$ ohm-cm, considerably greater than that of the mechanically alloyed composite.

EXAMPLE 4

To prepare an electromagnetic shielding material, 22 grams of General Electric SE6035 silicone gum rubber were added to the head of a Brabender Plasticorder TM equipped with cam blades. Mixing was initiated at 40 RPM after which 77 grams of WC/Al composite particles according to the invention were added. Mixing was continued for five minutes at 40 RPM after which time 2.8 grams of additional silicone gum rubber were added. Mixing was again continued for 10 minutes at 40 RPM, 0.5 grams of Lubersol 101 TM was added and mixing continued for five minutes at 40 RPM until a homogenous paste was obtained. Mixing was discontinued, the homogenous paste was discharged from the Brabender mixing head and placed in a mold 4"×6"×0.075" until the mold was filled. The material was then compressed in the mold using a press heated to 175° C. and exerting a pressure of 400 PSI. Constant temperature and pressure were maintained for 15 minutes after which the material was removed from the mold and allowed to cool. The cooled material was then placed in a convection oven for 15 minutes at 156° C. The resulting, rubberized material was then cut into six buttons having a thickness of 0.296 cm and a diameter of 2.261 cm. Each of the six buttons was then placed in a screw-vice and resistivity measurements were taken at various pressures. The results of these measurements are set forth in Table 5.

Another electromagnetic shielding material was prepared in the manner described above from WC/Al filled silicone at 75 wt. % loading of the filler. A button was die cut having a thickness of 0.071" and a diameter of 0.28". The volume resistivity of the button was measured with a resistivity press as described in the literature (10). The resistivity measurements are set forth in Table 6.

To assess the effect of loading of the conductive filler on the resistivity of the silicone shielding material, resistivity measurements were made on silicone compositions loaded with decreasing amounts of WC/Al conductive filler. The resistivity measurements are shown in Table 7. Table 7 indicates that the higher the loading of the WC/Al filler, the lower the resistivity.

TABLE 5

| Sample No. | Light Pressure | ¼ Turn | ½ Turn |
| --- | --- | --- | --- |
| 1 | 2.7 Ω | 1.50 Ω | 0.36 Ω |
| 2 | 2.0 Ω | 0.94 Ω | 0.48 Ω |
| 3 | 2.5 Ω | 1.25 Ω | 0.56 Ω |
| 4 | 3.8 Ω | 2.65 Ω | 1.10 Ω |
| 5 | 6.4 Ω | 5.20 Ω | 0.74 Ω |
| 6 | 3.7 Ω | 1.85 Ω | 0.92 Ω |
| Ave. Resistance | 3.5 Ω | 2.20 Ω | 0.69 Ω |
| Ave. Resistivity | 47.5 Ω cm | 29.80 Ω cm | 9.40 Ω cm |

TABLE 6

| PRESSURE (PSI) | RESISTIVITY (ohm-cm) |
| --- | --- |
| 2 | 0.92 |
| 20 | 0.29 |
| 40 | 0.20 |
| 80 | 0.14 |
| 120 | 0.11 |
| 160 | 0.09 |

TABLE 7

| WC/Al LOADING (wt. %) | RESISTIVITY (Ω-CM) AT 100 PSI |
| --- | --- |
| 80% | 0.09 |
| 75% | 0.15 |
| 70% | 0.78 |
| 65% | 12.2 |

EXAMPLE 5

In the following example, the resistivity to corrosion of known conductive powders, in particular Ag/Cu, Ag/Beads, and Ag/Al, was compared with the resistivity to corrosion of a composite, conductive powder in accordance with the present invention, namely WC/Al. In order to make the comparison, the salt spray test (11) was used.

The salt spray test is an accelerated environmental corrosion test. The samples to be tested are mounted in a specially constructed chamber and subject to a salt fog of 5% sodium chloride at 35° C. (95° F.) for a specific duration of time. The chamber of the salt fog apparatus is large enough so that the samples are subject to sufficient amounts of fog to insure uniform exposure and corrosivity. Samples are inspected on a daily basis and subjectively rated as to degree of corrosion. Electrical resistivity measurements are performed at regular intervals to determine performance changes of the samples.

Each of the conductive powders to be tested was compounded into silicone rubber as previously described and molded into a thin sheet. A circular shape was die cut from the sheet and sandwiched between a pair of aluminum disks, three inches in diameter. The aluminum disks were bolted together with sufficient pressure to compress the rubber sample to 90% of its initial thickness. Each of the four sandwiches was placed in the chamber of the salt fog apparatus. Electrical resistivity measurements were made across the sandwich in such a manner that the bolts would not affect the measurements. The results of the test are summarized in Table 8.

Table 8 shows that although the powder resistivity of the Tungsten Carbide/Aluminum (WC/Al) is 8 ohms .cm vs. $10^{-3}$ to $10^{-4}$ for the silver-coated powders, the resistivity drops when compounded into silicone. The other materials increased in resistivity when compounded. It should be noted that the predicted performance for corrosion resistance for WC/Al is confirmed by experiment in the salt spray test.

TABLE 8

Comparative Resistivity to Corrosion on Conductive Powders

| Particle | Powder ohm · cm | R Size | Wt. % Leading | Vol. % Leading | Corrosion Rating After 144 hrs. | Initial Resistivity ohm · cm | Resistivity After Salt Spray ohm · cm After 144 hrs. |
|---|---|---|---|---|---|---|---|
| Ag/Cu | $4.5 \times 10^{-4}$ | 45 M | 80 | 35.6 | 9.5 | $2.7 \times 10^{-2}$ | $3.8 \times 10^{-2}$ |
| Ag/Beads | $1.4 \times 10^{-3}$ | 42 M | 70 | 47.8 | 7.5 | $4.4 \times 10^{-2}$ | $1.0 \times 10^{-1}$ |
| Ag/Al | $3.5 \times 10^{-3}$ | 50 M | 73.7 | 50 | 5.0 | $8.1 \times 10^{-2}$ | $3.0 \times 10^{-1}$ |
| WC/Al | 8.0 | 75 M | 75.3 | 50 | 2.5 | $6.2 \times 10^{-1}$ | $7.6 \times 10^{-1}$ |

LIST OF REFERENCES

1. Conductive Elastomer Gasket Design, *EMI Shielding Engineering Handbook*, Chomerics, Inc., Woburn, Mass., 25:25–26 (1985).
2. *CRC Handbook Of Chemistry And Physics*, 56th Edition (Weast, Ed.), D51–D58 (1975–1976).
3. T. Yokoyama, Mechanofusion Treatment With Angmill And Its Potential In Industrial Application, Product Literature from the Micromeritics Laboratory of Hosokowa Micron International, Inc., Summit, N.J.
4. M. Alonso, Mechanism Of The Combined Coating-Mechanofusion Processing Of Powders, *Powder Technology*, 59:45–52 (1989).
5. T. Yokoyama et al., The Angmill Mechanofusion System And Its Applications, KONA, No. 5, 59–68 (1987).
6. A New Method Of Agglomerating Heterogenous Powders, *Particle Fabrication*, Product Literature of Bepex Corporation, Minneapolis, Minn.
7. An Introduction To Powder Modification Technology, *Powder And Bulk Engineering*, 50–54 (February, 1990).
8. J. S. Benjamin, Mechanical Alloying, *Scientific American*, 234:40–48 (1976).
9. B. Fultz et al., Mechanical Alloying Of Fe And V Powders: Intermixing And Amorphous Phase Formation, *J. Mater. Res.*, 4(6):1450–1455 (1989).
10. Military Specification - Shielding Gasket, Electronic, Elastomer, EMI/RFI, General Specification MIL-G-83528 (Apr. 1, 1988).
11. Standard Method Of Salt Spray (Fog) Testing, ASTM Designation:B117-85.

I claim:

1. A composite particle comprising in combination:
   an electrically conductive core material having a surface oxide layer; and
   an electrically conductive refractory material;
   said core material and said refractory material being conductively fused.

2. A particle as defined in claim 1, configured such that the refractory material provides a conductive path through said oxide layer to said core material.

3. A composite particle according to claim 1, wherein said refractory material breaches said oxide layer so as to make contact with said core material and extends outwardly from said oxide layer.

4. A composite particle according to claim 3, wherein said refractory material comprises a plurality of particles, each of which particles breaches said oxide layer so as to make contact with said core material and extends outwardly from said oxide layer.

5. A composite particle according to claim 1, wherein said core material comprises a metal or metal alloy.

6. A composite particle according to claim 5, wherein said metal is aluminum, tin, zinc, nickel or magnesium.

7. A composite particle according to claim 1, wherein said refractory material is WC, NbB, $NbB_2$, TiN, $VSi_2$, MoB, $TiB_2$, $ZrB_2$, $B_4C$, ZrN, $CoSi_2$ or $MoSi_2$.

8. A composite particle according to claim 1, wherein said core material is Al and said refractory material is WC.

9. A composite particle according to claim 1, wherein said core material is Al and said refractory material is TiN.

10. A composite particle according to claim 1, wherein said core material is Al and said refractory material is $VSi_2$.

11. A composite particle according to claim 1, wherein said core material is Al and said refractory material is NbB.

12. A composite particle according to claim 1, wherein said core material is Sn and said refractory material is WC.

13. A composite particle according to claim 1, wherein said core material is Sn and said refractory material is NbB.

14. A composite particle according to claim 1, wherein said core material is present in an amount of about 10 to 99.5 weight percent and said refractory material is present in an amount of about 90 to 0.5 weight percent.

15. A composite particle according to claim 1, wherein the core has a particle size of average dimension about 0.5 to 200 microns, the oxide layer has a thickness of about 2 to 10,000 angstroms and the refractory material has a particle size of about 0.005 to 20 microns.

16. A composite particle according to claim 1, wherein the particles of the refractory material are of size ranging from about twice the thickness of the oxide layer to about one tenth the size of the core particle.

17. A composite particle according to claim 1, wherein said core material has a hardness of about 1 to 6 Mohs.

18. A composite particle according to claim 1, wherein said refractory material has a hardness greater than the hardness of the core material.

* * * * *